US010598388B2

(12) United States Patent
Alexander

(10) Patent No.: US 10,598,388 B2
(45) Date of Patent: Mar. 24, 2020

(54) APPLIANCE WITH ELECTROVIBRATION USER FEEDBACK IN A TOUCH PANEL INTERFACE

(71) Applicant: Electrolux Home Products, Inc., Charlotte, NC (US)

(72) Inventor: Michael Alexander, Hermitage, TN (US)

(73) Assignee: Electrolux Home Products, Inc., Charlotte, NC (US)

( * ) Notice: Subject to any disclaimer, the term of this patent is extended or adjusted under 35 U.S.C. 154(b) by 674 days.

(21) Appl. No.: 15/093,663

(22) Filed: Apr. 7, 2016

(65) Prior Publication Data

US 2017/0292712 A1    Oct. 12, 2017

(51) Int. Cl.
*F24C 7/08* (2006.01)
*G06F 3/0488* (2013.01)
(Continued)

(52) U.S. Cl.
CPC .............. *F24C 7/086* (2013.01); *F24C 7/083* (2013.01); *G05B 15/02* (2013.01); *G06F 3/016* (2013.01); *G06F 3/04847* (2013.01); *G06F 3/04883* (2013.01); *G06F 3/04886* (2013.01); *H03K 17/96* (2013.01); *H03K 17/962* (2013.01);
(Continued)

(58) Field of Classification Search
CPC .......... F24C 7/083; F24C 7/086; G05B 14/02; G05B 15/02; G06F 3/016; G06F 3/04847; G06F 3/04886; G06F 3/04883; G06F 2203/014; H03K 17/96; H03K 17/962; H03K 2217/96066; H03K 2217/96062;
(Continued)

(56) References Cited

U.S. PATENT DOCUMENTS 6,933,474 B2    8/2005    Shukla et al.
7,924,144 B2    4/2011    Makinen et al.
(Continued)

FOREIGN PATENT DOCUMENTS

DE    10 2011 083 344 A1    3/2013
DE         102012201195           8/2013
(Continued)

OTHER PUBLICATIONS

International Search Report for PCT/US2017/026364, dated Jun. 30, 2017.
(Continued)

*Primary Examiner* — Michael G Hoang
(74) *Attorney, Agent, or Firm* — Pearne & Gordon LLP

(57) ABSTRACT

A cooking appliance includes a plurality of electrically controlled heating elements operable to elevate a temperature of food items. A user interface includes a touch-sensitive circuit that is operatively-connected to an external surface of the cooking appliance for altering operational settings of the electrically controlled heating elements. An electrovibration feedback circuit is coupled to the external surface that generates a vibratory feedback that is sensible by the user's finger at the external surface in response to adjustments of the operational settings. The electrovibration feedback circuit creates an electrostatic force on the user's finger that simulates friction between the user's finger and the external surface.

21 Claims, 3 Drawing Sheets

(51) Int. Cl.
  *G06F 3/0484* (2013.01)
  *G06F 3/01* (2006.01)
  *H03K 17/96* (2006.01)
  *H05B 1/02* (2006.01)
  *H05B 3/74* (2006.01)
  *H05B 6/12* (2006.01)
  *H05B 6/06* (2006.01)
  *G05B 15/02* (2006.01)

(52) U.S. Cl.
  CPC ............ *H05B 1/0261* (2013.01); *H05B 3/74* (2013.01); *H05B 6/065* (2013.01); *H05B 6/12* (2013.01); *G06F 2203/014* (2013.01); *H03K 2217/96062* (2013.01); *H03K 2217/96066* (2013.01)

(58) Field of Classification Search
  CPC ........ H05B 3/74; H05B 1/0261; H05B 6/065; H05B 6/12
  USPC ............... 219/620, 622, 391, 393, 396, 398; 345/173
  See application file for complete search history.

(56) References Cited

U.S. PATENT DOCUMENTS

| | | | |
|---|---|---|---|
| 7,982,588 | B2 | 7/2011 | Makinen et al. |
| 8,026,798 | B2 | 9/2011 | Makinen et al. |
| 8,174,373 | B2 | 5/2012 | Makinen et al. |
| 8,420,984 | B2 * | 4/2013 | Kaiser .................... H05B 3/746 219/448.12 |
| 8,441,465 | B2 | 5/2013 | Radivojevic et al. |
| 8,570,163 | B2 | 10/2013 | Makinen et al. |
| 2008/0143559 | A1 | 6/2008 | Dietz et al. |
| 2011/0037707 | A1 | 2/2011 | Radivojevic et al. |
| 2011/0074733 | A1 | 3/2011 | Mäkinen et al. |
| 2011/0285666 | A1 | 11/2011 | Poupyrev et al. |
| 2011/0285667 | A1 | 11/2011 | Poupyrev et al. |
| 2012/0229882 | A1 | 9/2012 | Fish, Jr. et al. |
| 2012/0237043 | A1 | 9/2012 | Radivojevic et al. |
| 2012/0327006 | A1 | 12/2012 | Israr et al. |
| 2013/0106758 | A1 | 5/2013 | Radivojevic et al. |
| 2013/0106765 | A1 | 5/2013 | Beecher et al. |
| 2013/0106774 | A1 | 5/2013 | Radivojevic et al. |
| 2013/0170013 | A1 | 7/2013 | Tonar et al. |
| 2013/0215065 | A1 | 8/2013 | Radivojevic et al. |
| 2013/0217491 | A1 | 8/2013 | Hilbert et al. |
| 2013/0307789 | A1 | 11/2013 | Karamath et al. |
| 2013/0311954 | A1 | 11/2013 | Minkkinen |
| 2014/0002239 | A1 | 1/2014 | Rayner |
| 2014/0031703 | A1 | 1/2014 | Rayner et al. |
| 2014/0049505 | A1 | 2/2014 | Radivojevic et al. |
| 2014/0059427 | A1 | 2/2014 | Dombrowski et al. |
| 2014/0353302 | A1 * | 12/2014 | Berr ...................... F24C 7/083 219/443.1 |
| 2016/0125375 | A1 * | 5/2016 | Magee .................. G07F 19/201 705/43 |
| 2018/0196990 | A1 * | 7/2018 | Xu .......................... G06F 3/041 |

FOREIGN PATENT DOCUMENTS

| | | |
|---|---|---|
| DE | 102014103480 | 9/2015 |
| EP | 1 876 394 A2 | 1/2008 |
| EP | 2107855 | 10/2009 |
| WO | 2010037758 | 4/2010 |
| WO | 2014/086566 A1 | 6/2014 |

OTHER PUBLICATIONS

Kaczmarek, et al.; "Polarity Effect in Electrovibration for Tactile Display"; IEEE Transactions on Biomedical Engineering; vol. 53, No. 10; Oct. 2006.

"Electrovibration—Wikipedia"; https://en.wikipedia.org/wiki/Electrovibration; Last retrieved: Jun. 15, 2015.

* cited by examiner

APPLIANCE WITH ELECTROVIBRATION USER FEEDBACK IN A TOUCH PANEL INTERFACE

CROSS-REFERENCE TO RELATED APPLICATIONS

Not applicable.

FIELD OF THE INVENTION

The present invention relates to user interface devices, and more particularly to user interfaces having touch sensors with feedback.

BACKGROUND OF THE INVENTION

User interface devices can include various touch sensors, including capacitive or resistive touch sensors. Arrays of touch sensors can be arranged side by side to create "sliders," which are touch inputs that can be activated by a user sliding a finger across the sensor array. The touch sensors of the array can have various shapes, such as linear to create a slider or even pie shaped and arranged in a disk to create a so-called radial slider.

A problem associated with touch-based slider devices is that unlike traditional knob inputs (e.g., potentiometers), sliders do not provide relative position or magnitude feedback to the user. A display can be associated with the touch slider to provide some feedback. However, the display would be mounted remote from the slider. This increases the size of the user interface (e.g., the slider and the remote display) and can render it unsuitable for applications requiring a compact user interface, such as a direct replacement for a knob input.

BRIEF SUMMARY OF THE INVENTION

The following presents a simplified summary of example embodiments of the invention. This summary is not intended to identify critical elements of the invention or to delineate the scope of the invention. The sole purpose of the summary is to present some example embodiments in simplified form as a prelude to the more detailed description that is presented later.

In accordance with one aspect, a cooking appliance comprises an electrically controlled heating element operable to elevate a temperature of food items and being configured to operate according to a first operational setting. A user interface comprises a touch-sensitive circuit operatively-connected to an external surface of the cooking appliance to sense movement of a user's finger over the external surface to input instructions for altering at least the first operational setting. An electrovibration feedback circuit is coupled to the external surface that generates a vibratory feedback that is sensible by said user's finger at the external surface in response to a control input made thereon for adjusting at least said first operational setting. The electrovibration feedback circuit is configured to generate said vibratory feedback via an electrostatic force that simulates friction between said user's finger and the external surface, and to adjust the vibratory feedback in a manner that corresponds to, and thereby reflects, an adjustment of said first operational setting based on said control input. A controller is operatively connected to said user interface and is configured to make said adjustment of said first operational setting in response to said control input.

In accordance with another aspect, a cooking appliance comprises an electrically controlled heating element operable to elevate a temperature of food items, comprising a first electrically controlled heating element operable via a first operational setting. An auxiliary electronic control is operable via a second operational setting to alter an auxiliary feature of the cooking appliance that is unrelated to the electrically controlled heating element. A user interface comprises a touch-sensitive circuit operatively-connected to an external surface of the cooking appliance to sense movement of a user's finger over the external surface to input instructions for independently adjusting the first and second operational settings. An electrovibration feedback circuit is coupled to the external surface that generates a vibratory feedback that is sensible by said user's finger at the external surface in response to a control input made thereon for adjusting the first and second operational settings. The electrovibration feedback circuit is configured to generate said vibratory feedback via an electrostatic force that simulates friction between said user's finger and the external surface and to adjust the vibratory feedback in a manner that corresponds to, and thereby reflects, an adjustment of said first operational setting based on said control input. The vibratory feedback is different for an adjustment of the first operational setting as compared to adjustment of the second operational setting. A controller is operatively connected to said user interface and is configured to make said adjustment of the first and second operational settings in response to said control input.

It is to be understood that both the foregoing general description and the following detailed description present example and explanatory embodiments. The accompanying drawings are included to provide a further understanding of the described embodiments and are incorporated into and constitute a part of this specification. The drawings illustrate various example embodiments of the invention.

BRIEF DESCRIPTION OF THE DRAWINGS

The foregoing and other aspects of the present invention will become apparent to those skilled in the art to which the present invention relates upon reading the following description with reference to the accompanying drawings, in which.

DESCRIPTION OF EXAMPLE EMBODIMENTS

Figure 1:
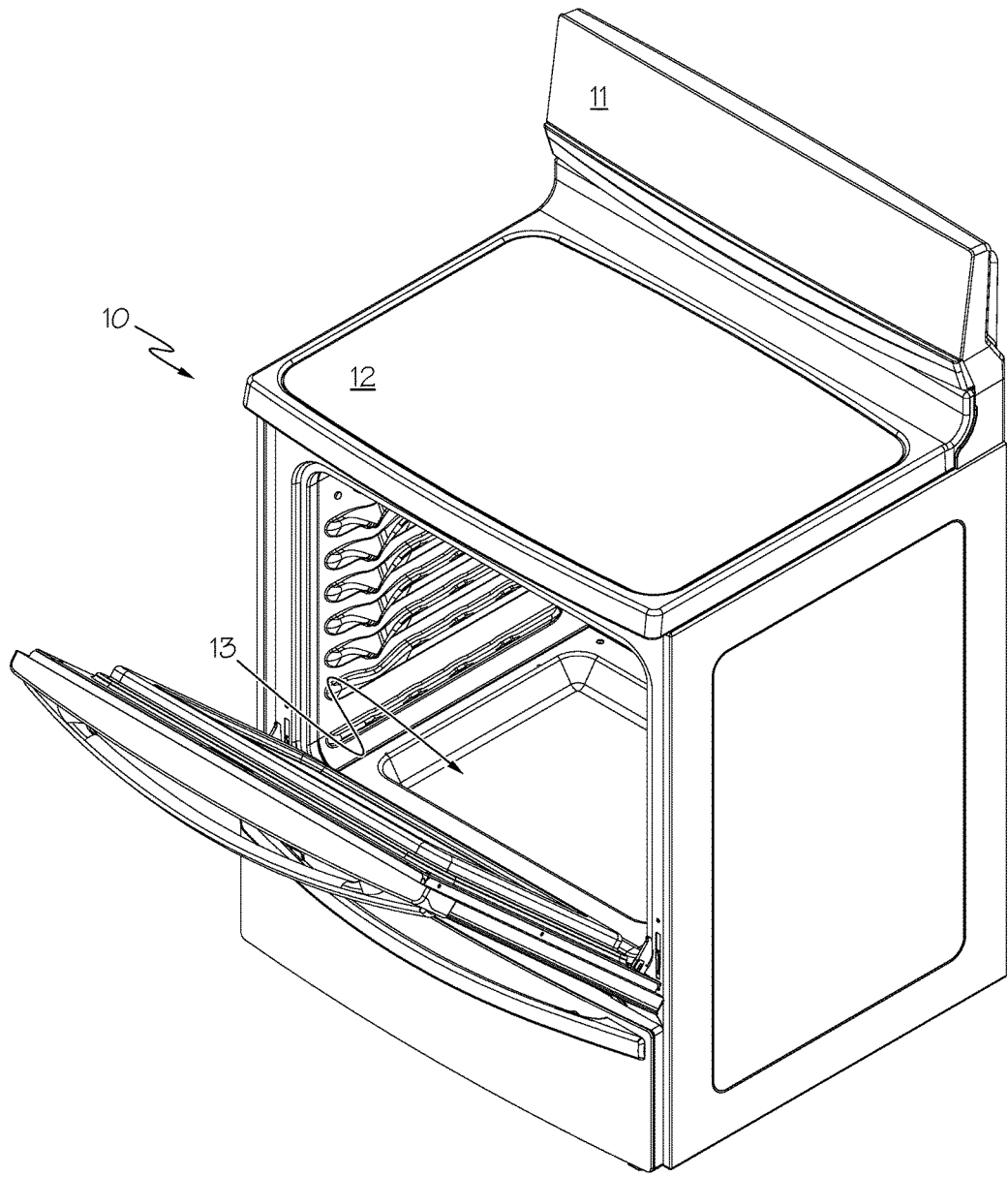
FIG. 1 is a schematic view of an example cooking appliance.

Example embodiments are described and illustrated in the drawings. These illustrated examples are not intended to be a limitation on the present invention. For example, one or more aspects can be utilized in other embodiments and even other types of devices. Moreover, certain terminology is used herein for convenience only and is not to be taken as a limitation. Still further, in the drawings, the same reference numerals are employed for designating the same elements.

In the instant application, electrovibration is used to electrically add a "texture" or perceived "friction" to the touch-sensor surface, allowing additional feedback beyond merely visual feedback to a user. Electrovibration technology was discovered in the 1960's, and functions by electrically changing the perceived friction between a user's finger and the surface it is in contact with such that a user perceives a unique "texture" while sliding their finger across the surface. Electrovibration has been provably determined to be easily variable on the stick-waxy and rough-smooth scales of touch classification through electrical mechanisms alone. In electrovibration, an electrostatic force is created by applying a time varying voltage between an electrode and an insulated ground plane. When a finger scans over an insulated plate with a time varying voltage, the finger works as the induced ground plane. The induced static electricity creates an electric force field between the finger and the surface.

Implementing electrovibration feedback across a touch-sensitive input surface in the market would allow for an additional level of user feedback which can be electrically controlled. Such feedback can therefore vary based on various modes and settings the user has previously chosen to give a better qualitative indication of the selected settings. One example is to increase how rough and sticky a surface feels to a user as he slides his finger along a slider control pad to increase the temperature of an oven cavity, or change the power output or cooking zone size of cooktop heating element(s).

The user interface described herein can be used to control operations of devices requiring an amount, level or magnitude setting. In particular, the user interfaces can be part of a control panel for a domestic appliance, for controlling operations of the appliance. Example domestic appliances include dishwashers, washing machines, clothes dryers, refrigerators, freezers, stoves, cooktops, microwave ovens, etc. Turning to the shown example of FIGS. 1-2, a domestic or industrial cooking appliance 10 is illustrated with a touch-based user interface. The cooking appliance 10 can have a cooktop or range portion with a cooktop surface 12 with a plurality of electrically controlled heating elements 14, 16, 18 operable to elevate a temperature of food items. The cooktop surface 12 can be a substantially-planar glass pane that conceals the heating elements, although at least in the case of a gas burner the cooktop surface could be at least partially metallic. The heating elements 14, 16, 18 can be various types, such as electrical resistance elements, induction heating elements, or even gas burners. Similarly, the heating elements could apply to cooktop surfaces (e.g., ranges, cooking hobs) or enclosed cooking ovens, or even outdoor grills. For brevity and simplicity, the user interface will be described herein with reference to electric heating elements, but it is to be understood that the user interface could similarly be applied to gas burners that are controlled by electrically-controlled gas valves. The cooking appliance can also include an oven cavity 13 closed by a door for baking or broiling food items, and may further include an electrically controlled bake heating element, broil heating element, and/or convection heating element with a fan (any of which can be electric elements or electrically-controlled gas elements).

Each electrically controlled heating element has at least one operational setting, which may relate to a single-segment heating element or a multi-segment heating element. In this regard, the operational setting may relate to the heating element as a whole, or to one or more individual segments of a multi-segment design. Likewise, one or more auxiliary electronic control(s) can have at least one operational setting that is operable to alter an auxiliary feature of the cooking appliance that is unrelated to the electrically controlled heating element(s). Any or all of the heating elements 14, 16, 18 can include a single segment or a multi-segment construction that can provide a variable size cooking zone. For a multi-segment construction, a plurality of electrically controlled heating elements can include a first electrically controlled heating element with a first operational setting and a second electrically controlled heating element with a second operational setting that is independently controllable from the first operational setting; e.g. to independently select the power of each of the first and second heating elements. The size of the cooking zone can be increased or decreased by selective operation of the first and second electrically controlled heating elements. In the examples shown in FIG. 2, one heating element 14 can include a pair of spaced-apart outer heating segments 14a, 14c with bridge segment 14b located therebetween. In another example, a heating element 18 can include a two or more concentric inner and outer heating segments 18a, 18b, 18c. Thus, for the heating elements 14 or 18, changing the operational settings of the different segments 14a, 14b, 14c or 18a, 18b, 18c with respect to their individual power settings will thereby change the size and/or power output of the cooking zone area provided by each heating element 14, 18. For example, a user could choose to operate element 14a alone for a relatively small cooking pot, or for a low power (e.g., simmer) operation. The user could even choose to operate the outward segments 14a, 14c separately for use with two smaller pots. Alternatively, the user could choose to simultaneously operate two or more adjacent segments (i.e., 14a, 14b or 14b, 14c) or even all three segments (14a, 14b, 14c) if larger cooking vessels are being used (similarly for segments 18a, 18b, 18c). In addition to controlling an on/off state, the respective operational settings can further control the amount of power supplied to each segment 14a, 14b, 14c. The level of power output of each segment 14a, 14b, 14c can be increased or decreased independently or together in a chained operation. Similar operations can be performed with each electrically controlled heating element 16, 18 and any others provided to the oven cavity 13.

A user interface 20 can control operations of the heating elements according to user touches on the interface, which may be on the cooktop or elsewhere. A controller 22 is operatively connected to the user interface 20, and alters the operational settings of the respective heating elements 14, 16, 18 (or individual segments thereof) in response to instructions input via the user interface 20. A power unit 24 is operatively connected between the controller 22 and the heating elements 14, 16, 18, (and may even be part of the controller), to thereby control electrical power supply to the heating elements 14, 16, 18 (or individual segments thereof). In this manner, the controller 22 (via the power unit 24) can alter, e.g., respective first and second operational settings of the electrically controlled heating elements by turning them on or off (or by opening/closing electrically controlled gas valves), and by increasing or decreasing a level of power output of the first and second electrically controlled heating elements (including altering the power output of the heating element as a whole, or to one or more individual segments thereof).

In the case of an electric induction heating element 16, the power unit can provide or drive a generator to conduct a high-frequency (e.g., at least 10 kHz, at least 20 kHz, etc. . . . ) alternating current to be conducted through a wound heating coil 17 to thereby induce an induced current in a cooking vessel supported above the heating coil 17. In the case of an electric resistance element 18 heated by current flowing therethrough, the power unit can deliver and regulate voltage and/or current to the heating element 18 to produce the desired heat output. In the case of a gas burner, the controller 22 and power unit 24 can be similarly used to control electrically operated gas valves. The power unit 24 controls various operations of the heating elements 14, 16, 18, including initialization of the elements, power output, and/or synchronization. It is further understood that a single power unit 24 may control all of the heating elements 14, 16, 18 (including all individual segments thereof), or multiple power units can be used to control one or more of the heating elements 14, 16, 18 or one or more of the heating segments within each or several of those elements. For example, in a hybrid induction-electric cooktop that includes both electrical resistance elements and induction heating elements, one power unit can be provided for the induction element(s) and another power unit can be provided for the electrical resistance element(s). It is understood that one or more power units can be used with various configurations of heating elements. The controller 22 and power unit 24 can similarly be used to control the bake, broil, and convection elements of the oven cavity.

Figure 2:
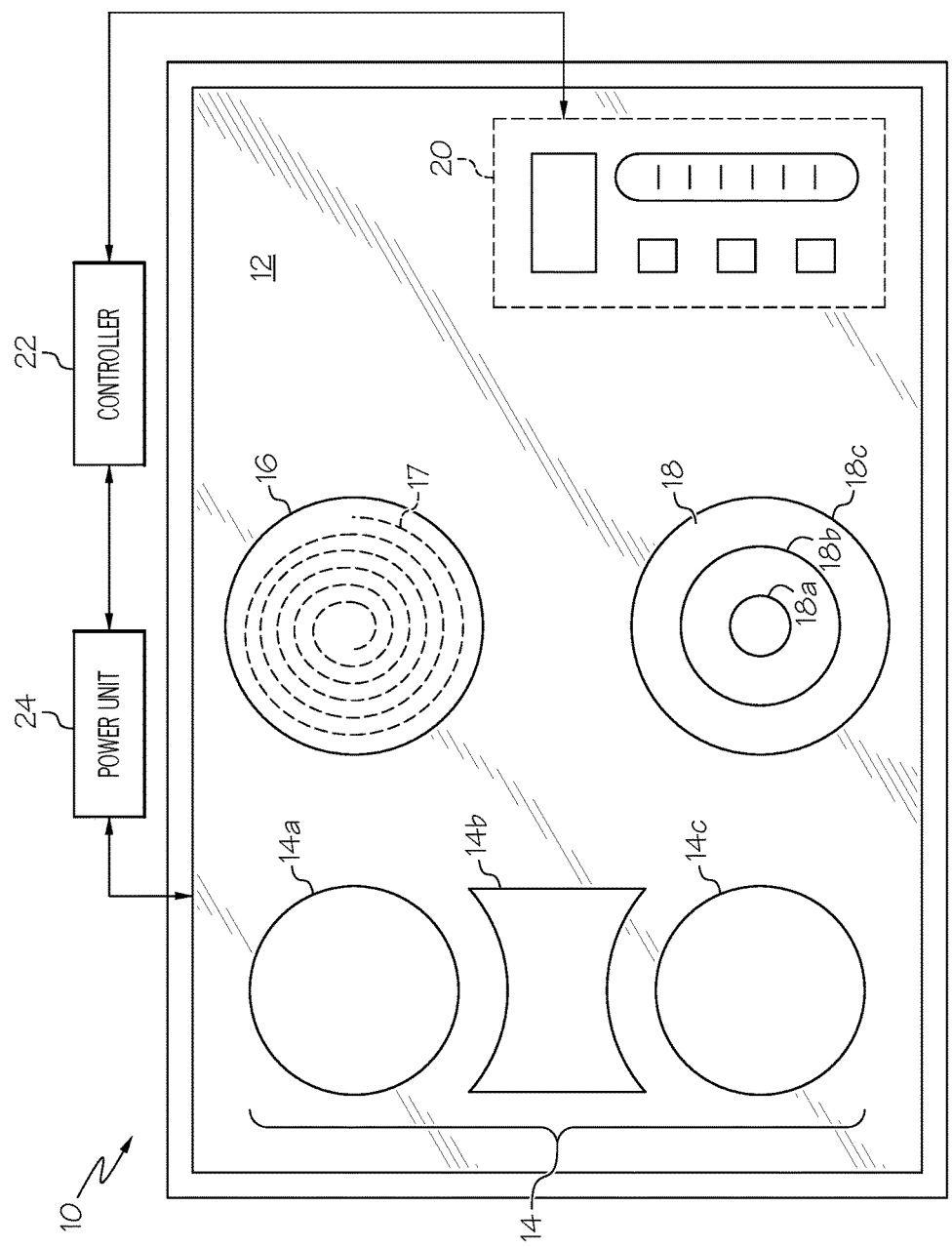
FIG. 2 is a schematic view of an example cooktop.

In the case of an electric cooktop, the plurality of electric heating elements can be supported below the cooktop surface 12 (often referred to as a "glass top" cooking surface), and cooking vessels supported directly upon the cooktop surface 12 vertically above the heating elements. In one example, the user interface 20 can be a part of the cooktop surface 12 such that the cooktop surface 12 is the external surface of the user interface 20. For example, as shown in FIG. 2, the user interface 20 can be located towards the right-hand side of the cooktop 12, while the heating elements are on the left-hand side. This can provide the benefits of a single glass top cooking surface with spill-resistance and a pleasing appearance. Still, other configurations are considered, such as where the user interface 20 can be provided on a separate substrate layered upon the cooktop 12 (such as a drop-in control system), or where the user interface 20 is provided on another surface of the cooking appliance (such as a front panel 11) that is separate from the cooktop 12.

Generally speaking, the user interface 20 includes a touch-sensitive circuit operatively-connected to an external surface of the cooking appliance to sense movement of a user's finger over the external surface to input instructions for altering operation of the heating elements. The touch-sensitive circuit can include various techniques for sensing movement of the user's finger, such as a capacitive-touch sensor, a resistive-touch sensor, an infrared-touch sensor, camera-based input, etc. Conventionally, capacitive touch interfaces are operated by detecting the capacitance that a user's finger adds to a circuit when they touch a monitored surface. However, because such touch-based systems are commonly provided upon a flat and low-friction surface (such as glass or plastic), the conventional touch-systems provide little or no feedback to the user.

Figure 3:
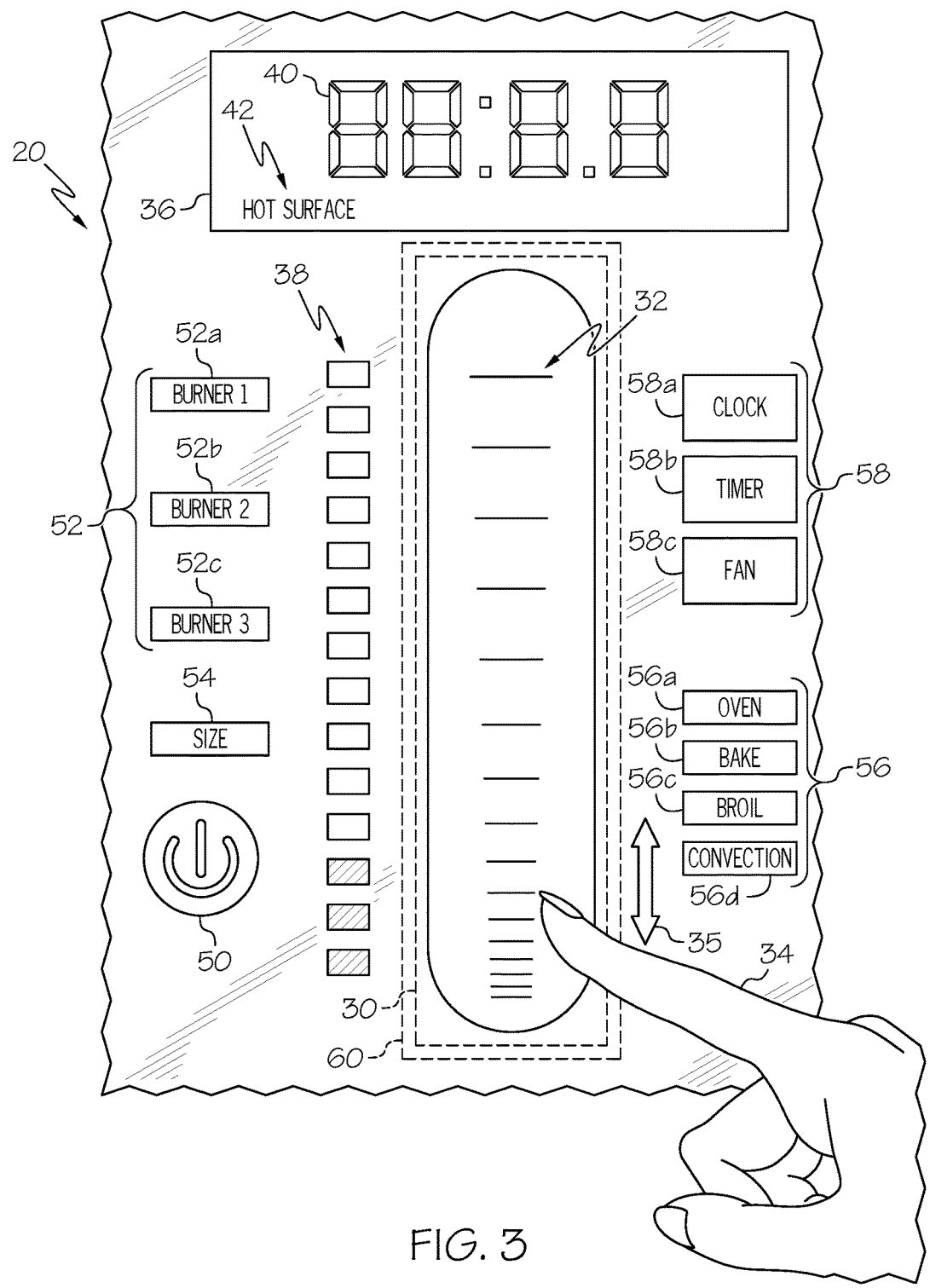
FIG. 3 is a schematic view of an example user interface.

Turning now to FIG. 3, an example user interface 20 is illustrated schematically. The user interface 20 includes a printed circuit board 30 (shown hidden) or a flexible circuit board that includes suitable touch sensor electrodes arranged into a suitable touch sensor array 32. In one example, based on capacitance changes at the electrodes, the touch sensor circuitry determines the occurrence of touch events. The touch sensor array 32 can be shaped variously, such as linear, curved, annular, etc. to match the desired human interface design for interaction with the user's finger 34. A display device 36 is located adjacent the touch sensor array 32. It is to be appreciated that any number of user interfaces could be provided, such as one user interface, two user interfaces, four user interfaces, etc. Additionally, although only one touch sensor array 32 is shown, it is understood that multiple can be provided.

A bar graph 38 is located adjacent within the touch sensor array 32 to provide a visual feedback to the user. The bar graph 38 is located entirely along the length of the touch sensor array 32, although it could be longer or shorter. In other embodiments, the bar graph 38 could even be located inside or overlaid upon of the touch sensor array 32. Additional fixed text elements could similarly be provided along the bar graph 38 of the touch sensor array 32. Additionally, a multi-segment display 40 and fixed text elements 42 are located within the display device 36, which can convey information both graphically and alphanumerically at the same time. The multi-segment display 40 is a numerical display (i.e., capable of displaying numbers and optionally letters and/or characters). In an embodiment, the multi-segment display 40 can display variable alphanumeric information. The display device 36 can also include fixed text elements 42 located adjacent to the multi-segment display, for selectively displaying fixed strings of text.

The bar graph 38, multi-segment display 40 and fixed text elements 42 have light-emitting elements associated therewith for creating the displayed information through selective activation of the light-emitting elements. Example light-emitting elements can include for example, LEDs, vacuum fluorescent displays and liquid crystal displays. Still, it is to be appreciated that any other suitable light-emitting element can be used. Moreover, any or all of the bar graph 38, multi-segment display 40 and fixed text elements 42 could utilize movable displays, such as LCD, OLED, or plasma displays that are capable of displaying grayscale or color images (static or video). It is to be appreciated that the bar graph 38, multi-segment display 40 and fixed text elements 42 can be provided in a common housing or as separate components, and part of the printed circuit board 30 or separate therefrom.

The bar graph 38 is formed by a plurality of light-emitting elements arranged in an array, such as a line or circle. Each light-emitting element forms a small segment of the bar graph 38. It is to be appreciated that the bar graph 38 can include more or fewer light-emitting elements than illustrated. Additionally, the light-emitting elements can be equally spaced, or certain portions may be clustered closer together or spaced farther apart. Via selective activation of the light-emitting elements, various display effects can be created using the bar graph 38. For example, a single light-emitting element can be activated to provide a small light segment. The small light segment can be made to move upwards or downwards along the linear bar graph 38 (or clockwise or counterclockwise around an annular display) by appropriately activating and deactivating light-emitting elements in sequence. The small light segment can be lengthened in a particular direction by activating adjacent light-emitting elements. The lengthened light segment can be made to move along the bar graph 38 and can also be contracted or shortened into a smaller light segment. Further, multiple light segments can be displayed and made to move about the bar graph 38 or lengthened/shortened simultaneously. As shown, three light emitting elements are illuminated on the bar graph 38.

As noted above, the multi-segment display 40 can display variable alphanumeric information. The variable alphanumeric information can be related to information displayed graphically by the bar graph 38. For example, a light segment displayed by the bar graph 38 can graphically represent a level (e.g., a power level). The same level can simultaneously be displayed as a number on the multi-segment display 40. As the light segment moves or is lengthened/contracted on the bar graph 38, the number displayed by the multi-segment display 23 can change correspondingly. For example, when setting temperature, the bar graph 38 may provide a visual representation of a relative amount along a continuum (i.e., a gauge effect showing 30%, 40%, 60% or other value) while the multi-segment display 40 can display an actual temperature (i.e., 360 degrees). The bar graph 38 and multi-segment display 40 can also display different information. For example, the multi-segment display 40 can display a level setting set by a user while the bar graph 38 displays a monitored condition, such as a temperature, or vice-versa. As noted above, the display device 36 can include fixed text elements 42 for selectively displaying fixed string s of text. The fixed text elements 42 can be displayed by activating one or more light-emitting elements associated with the text elements 42. In FIG. 3, the example text element "hot surface" can be displayed by simultaneously activating one or several light-emitting elements that are associated with the text element.

The user interface 20 can further include additional buttons for operating other features. These buttons can be provided variously, such as capacitive touch buttons, membrane buttons, physical switches, etc. When the user interface 20 is incorporated into the glass cooktop surface 12, these other buttons are preferably provided so as to be operable through the cooktop surface 12 (e.g., capacitive touch or similar touch-operated switches). Example buttons can include an on-off button 50 for activating/deactivating the user interface 20 or even the appliance generally 10, heating element buttons 52 (shown as 52a, 52b, 52c) for selectively operating the particular heating elements 14, 16, 18, a heating element size button 54, oven buttons 56 (shown as 56a, 56b, 56c, 56d) for operating the oven cavity 13, and auxiliary control buttons 58 (shown as 58a, 58b, 58c) for operating auxiliary electronic control features. Although certain buttons are described, it is understood that any desired buttons can be provided.

As noted, the user interface 20 can be a part of the cooktop surface 12 such that the cooktop surface 12 provides the external surface for the user interface 20. In FIGS. 2-3, the cooktop 12 is the touch surface and the printed circuit board 30 (including the touch sensor electrodes) and displays 38, 40, 42 are attached (e.g., fastened or adhered) to the underside of the cooktop 12. For example, the circuit board can be glued or otherwise held (e.g., via a bracket or the like) to the underside of the cooktop. The cooktop 12 has the touch control area in register with the user interfaces, which are mounted directly beneath the touch control area. The touch control area includes graphics to inform the user of the location of the annular touch sensor arrays. Optionally, the touch surface (e.g., the cooktop 12) can be translucent or light-diffusing so that the annular bar graph, multi-segment display and fixed text elements are not visible when their corresponding light-emitting elements are deactivated.

Operations of the user interfaces 20 are controlled by the one or more controllers 22 (schematically shown in FIG. 2) in response to instructions input via the user interface. The controller 22 can be part of the circuit board 30 of the user interface, or remote from the user interface board. The controller 22 can include a processor for executing a set of programmed instructions that cause the controller to provide the functionality ascribed to it herein. In an embodiment, the processor and touch sensor circuitry are included within a single integrated circuit. In another embodiment, the processor and touch sensor circuitry are provided in separate integrated circuits and the processor communicates with the touch sensor circuitry. It is to be appreciated that a controller including the touch sensor circuitry could be formed from discrete electronic components. The controller 22 monitors the touch sensor electrodes for occurrences of touch events.

The controller 22 selectively controls the power unit 24 of the cooking appliance, and correspondingly activates the light-emitting elements of the display devices. In embodiments, the controller 22 can communicate with remote devices or even other controllers. Each user interface 20 can have a dedicated controller 22, or alternatively a single controller can control multiple user interfaces.

The user interface 20 further includes an electrovibration feedback circuit 60 coupled to the external surface (such as the cooktop 12) that generates a vibratory feedback that is sensed by the user's finger 34 at the external surface (such as the cooktop 12) in response to adjustments of various settings and features input via the user interface 20. The electrovibration feedback circuit 60 operates to create an electrostatic force on the user's finger 34 that simulates friction between the user's finger and the external surface (such as the cooktop 12). The electrovibration feedback circuit 60 is electrically controlled by the controller 22 or by an independent control system, and includes an electrode carrying a time varying voltage from an AC source. An insulated plate is located over the electrode. When the user's finger moves over the insulated plate with the electrode carrying the time varying voltage, the user's finger works as the induced ground plane to create an electrostatic force. Changes to the time varying voltage on the electrode can thereby change the electrostatic force to change how rough and sticky, or smooth or waxy, a surface feels to the user as he slides his finger along the touch sensor array 32. In the shown example, the external surface is the cooktop surface, which acts as the insulated plate. However, it is understood that the user interface 20 could be provided as a separate unit with its own external interface and the description herein will similarly apply. The electrovibration feedback circuit 60 could be provided as a vibration unit that is substantially co-extensive with the touch sensor array 32 so that the simulated friction event can be felt by the user along substantially the entire range of motion offered by the touch sensor array. In another example, the electrovibration feedback circuit 60 could be provided as less than co-extensive with the touch sensor array 32, or even as one or more discrete vibration unit(s) that is located spaced apart from the touch sensor array 32. Alternatively the feedback circuit 60 could extend beyond the specific array 32, e.g. to provide electrovibratory feedback indicative of a user attempting to input a control instruction that would exceed the available magnitude of the controlled function.

Thus, the electrovibration feedback circuit 60 provides the user with haptic feedback along the touch sensor array 32. As noted above, the electrovibration feedback circuit 60 provides this feature electrically as an electrostatic force between the user's finger 34 and the cooktop surface 12 without any printed or physical surface features that extend above the major expanse of the surface. As a result, the touch sensor array 32 can be operated safely even in difficult cooking conditions that include greasy, hot and wet environments. Additionally, by increasing the perceived friction to the user when increasing a setting, the touch sensor array 32 can be operated more accurately and precisely and also provide physical, real-time feedback to the user indicative of the magnitude of his control input.

Example operations of the user interface 20 will be described below in the context of setting a cooking zone size and power level for a heating element in a cooktop. Referring to FIGS. 2-3 a user can first operate an on-off button 50 for activating/deactivating the user interface 20 or the appliance generally 10, or even for activating/deactivating a particular heating element, and can then select the particular heating element he wishes to control via the buttons 52 (shown as 52a, 52b, 52c). A similar operation can be done for operating the oven cavity 13 via oven buttons 56 (shown as 56a, 56b, 56c, 56d). A user can slide a finger 34 in a linear motion 35 (up/down) or circular motion (clockwise or counterclockwise) along the touch sensor array 32 (as appropriate) to provide an input to the touch sensor controller 22. The input can provide a magnitude or level setting to the controller 22. For example, sliding the user's finger 34 in a first direction, e.g., upwards, increases a power level setting for a corresponding heating element. Sliding the finger 34 in a second direction, e.g., downward, decreases the power level setting for the corresponding heating element. In addition or alternatively, the user could selectively adjust the size of a cooking zone in a similar manner. The user interface 20 could provide a dedicated heating-element size button 54, whereupon sliding the user's finger 34 in a first direction, e.g., upwards, increases a cooking zone size for a corresponding heating element (e.g., energizing segments 14a and 14b, and possibly also 14c if desired, similar to segments 18a, 18b, 18c), while sliding the finger 34 in a second direction, e.g., downward, decreases the cooking zone size (e.g., by de-energizing elements). The power level or cooking zone size for the heating elements can additionally be set using the additional discrete touch sensor electrodes, such as a "plus" function to increase the power level/size setting and a "minus" function to decrease the power level/size setting. The power level and zone size can be coupled together or de-coupled. It is to be appreciated that the user interface 20 could provide both an analog-type input via the annular touch sensor array and a digital-type input via the additional touch sensor electrodes.

The magnitude of the power level setting can be displayed to the user by the bar graph 38 and the multi-segment display 40. As the user slides the finger 34 to increase the power level, a light display is generated by the bar graph 38. For example, the light segments displayed by the bar graph can be made to lengthen as the power level is increased, or a small light segment can be made to move with the finger 34 as power level is increased. As the power level is decreased, the light segment can be made to contract or shorten, or the small light segment can be made to move with the finger 34. It is to be appreciated that the bar graph 38 imitates an analog gauge and graphically displays information to the user in an analog-type format. While the bar graph 38 displays the power level information graphically, the multi-segment display 40 displays the power level information numerically or alphanumerically. For example, the multi-segment display 40 can display a decimal number to indicate the power level (e.g. "7.3"), or text such as "HI" or "LO" to indicate the power level. The display device, therefore, can display information both graphically and through text.

An example power-setting operation can include sliding the finger 34 from a low-point position on the touch sensor array 32 to a mid-point position to establish a "medium" power level setting. As the finger 34 is moved to the mid-point position, a light segment can lengthen or move with the finger, and the multi-segment display 40 can display appropriate text (e.g., "5.0"). Subsequently, the finger 34 can be slid downwards from the mid-point position back to the low-point position to reduce the power level setting. As the finger 34 is moved back towards the low-point position, the light segment can shorten or move with the finger, and the multi-segment display 40 can display appropriate text (e.g., "2.5"). A similar effect can be achieved (e.g., lengthening the light segment and displaying appropriate text "10.0") for increasing the power setting.

In addition to altering the visual feedback to the user, the electrovibration feedback circuit 60 of the user interface 20 can operate simultaneously to adjust the simulated friction between the user's finger and the external surface (such as the cooktop 12). The amount of simulated friction can be altered in response to various inputs received from the user with respect to cooking-related functions, or even auxiliary features that are unrelated to cooking functions. Different examples will be discussed below. It is understood that any or all of these, as well as other features related to operation of the appliance 10, can be used with the electrovibration feedback circuit 60 to provide additional tactile feedback to the user.

In one example, where the cooktop of the appliance includes a variable size cooking zone comprising a plurality of electrically controlled heating elements, an amount of the vibratory feedback can be increased when the size of the cooking zone is increased (or vice-versa, vibratory feedback can be decreased when the size of the cooking zone is decreased). Increasing the feedback in response to cooktop settings could also allow users to get a better sense of the amount of energy being applied to the food being cooked by increasing the tactile feedback properties of the slider based on the size of a variable size zone. For example, increasing the size of a 3-element cooking zone would correspondingly increase the tactile feedback for any additional power level changes. In the case of FIG. 2, where the heating element 18 includes three concentric inner and outer heating elements 18a, 18b, 18c, increasing the size of the cooking zone by changing the operational settings of the different elements 18a, 18b, 18c with respect to their individual power settings will thereby cause a corresponding increase in the tactile feedback provided to the user's finger by the electrovibration feedback circuit 60. By increasing the tactile feedback, the electrovibration feedback circuit 60 can increase the simulated friction between the user's finger and the external surface (such as the cooktop 12) as the size of the cooking zone is increased, effectively making the user overcome increased resistance when attempting to increase the size of the cooking zone. A similar operation can be done in reverse (decreased friction as the cooking zone size is decreased).

Additionally, where the appliance includes a first electrically controlled heating element with a first operational setting and a second electrically controlled heating element with a second operational setting, at least one of the first operational setting and the second operational setting can be adjustable in a non-linear manner. When a heating element is adjustable in a non-linear manner, it can be difficult for a user to achieve a desired control. This is especially true when one heating element is adjustable in a linear manner, while another is not. Thus, a non-linear heating element can be better indicated and controlled by the user if the resolution or granularity of changes on the user interface are provided via similar feedback as that of a linear heating element, wherein a different degree of electrovibratory feedback would be indicative of a different granularity or scale of changes between different operational settings, or between different adjustment modes of the same operational setting. Users frequently use cooktop elements such that they want very precise settings at very low heat levels, but want less precise settings at higher heat levels. With a touch-based, sliding-input pad where the user slides a finger on an elongated capacitive touchpanel, a texture-like feedback mechanism using the electrovibration feedback circuit 60 could provide an additional form of user feedback regarding the non-linear nature of the input. Since the power level is controlled electronically (e.g., by changing the power supplied to an electrically powered heating element, or by changing the gas flow to an electrically controlled valve), the relationship between the finger position on the touch sensor array 32 and the power output can be nonlinear, and even nonuniform such that the relationship cannot be expressed as an equation.

In one example of more precise settings at low heat levels as compared to high heat levels, the power level can be incremented in steps of 0.2 units from levels 1.0 to 3.0, and in larger steps of 0.5 units from levels 3.0 to 9.0 (these numbers represent arbitrary units, and are provided only to illustrate the concept of non-linear, non-uniform control as a function of control magnitude). This allows more precise control in the lower heating ranges, which is useful for cooking and keeping food warm, while providing less precise control at elevated heating ranges typically used for pre-heating or boil-up, which do not typically benefit from precise control. A schematic, graphical example of a touch panel that can be used to accept non-linear control inputs is shown in FIG. 3 with the line delineations of the touch sensor array 32 being shown as relatively closer together at the lower end, and relatively farther apart at the higher end of the array 32. The bar graph 38 lights may similarly be spaced closer or farther apart at certain ranges, or may be constantly spaced apart. It is contemplated that each light of the bar graph 38 may be a single color, or multi-color. For example, when used to indicate a range of smaller incremented steps (e.g., the 0.2 units discussed above), each light of the bar graph 38 may provide multiple colors (e.g., off, yellow, orange, red) to indicate the gradual steps, while the larger incremented steps (e.g., the 0.5 units discussed above) may indicate lesser colors or even a single color (e.g., off, red).

Using the electrovibration feedback circuit 60 to provide tactile feedback, the amount of simulated friction on the user's finger can be correspondingly altered non-linearly or in different manners. With regard to the first electrically controlled heating element with the first operational setting and the second electrically controlled heating element with the second operational setting, the electrovibration feedback circuit 60 can respond with simulated friction on the user's finger in different manners. In one example, where an adjustment increment of the first operational setting is different than an adjustment increment of the second operational setting (e.g., power level incremented in steps of 0.2 units versus 0.5 units), the vibratory feedback can be approximately equal for an incremental adjustment of both the first and second operational settings.

In a further embodiment, the first electrically controlled heating element can include a relatively lower, first power output range (e.g., useful for simmer and keep warm operations) and a relatively greater, second power output range (e.g., useful for boiling operations). The first power output range provides a first maximum power output to the first electrically controlled heating element, and the second power output range provides a second maximum power output to the first electrically controlled heating element that is greater than the first maximum power output. An adjustment increment of the lower, first power output range can be smaller than an adjustment increment of the greater, second power output range, and the vibratory feedback can shift from relatively low in the first output range to relatively high in the second output range.

The feedback also can be provided to the user at an increased rate or frequency, although at similar finger friction magnitudes, depending on the number of incremental steps in a particular range. As the user approaches the outermost limits of each range (e.g., the first and second maximum power outputs), the frequency or occurrences of finger friction magnitude may increase per unit time or finger distance travelled, although the increase may be more noticeable in the lower power range with smaller step increments due to the greater number of instances, as compared to the larger step increments in the larger power range. The same can be done in reverse as the user approaches the lower outermost limits of each range (e.g., first and second minimum power outputs), the finger friction amounts may decrease. In still another example, the magnitude of finger friction can increase when the speed of the user's finger across the touch sensor array 32 increases. That is, as the user makes faster input changes, the finger friction feedback can become larger, and vice versa (less friction for slower changes).

In an alternative example, where the adjustment increment of the first operational setting is different than an adjustment increment of the second operational setting (e.g., power level incremented in steps of 0.2 units versus 0.5 units), the vibratory feedback can be greater for an incremental adjustment of the first operational setting as compared to the vibratory feedback for an incremental adjustment of the second operational setting. The amount of friction can be greater when the incremental changes are greater, or vice-versa. In another example, as the user approaches the outermost limits of each range (e.g., the first and second maximum power outputs), the magnitude of finger friction can continuously increase to be perceived rougher and stickier such that the user applies greater force to overcome the resistance of the electrovibration feedback circuit 60. This can be particularly useful to provide increased feedback (e.g., increased finger friction) for highly granular changes for a low power (e.g., simmer) operation, so that the user has a very high degree of understanding and greater control in the lower heating range.

Different feedback can also be useful when the user interface 20, and especially the touch sensor array 32, is shared among multiple heating elements having different non-linear setting characteristics, such as induction-electric hybrid cooktops and cooktops with both warmer zones and regular electrical cooking elements. A similar function can occur when the user interface 20 is used to control both of the cooktop heating elements, as well as the oven heating elements. The user can select the cooking function using the appropriate buttons, including heating element buttons 52 (shown as 52*a*, 52*b*, 52*c*) for selectively operating the particular heating elements 14, 16, 18 and oven buttons 56 (shown as 56*a*, 56*b*, 56*c*, 56*d*) for operating the oven cavity 13. Once the desired oven cooking function is selected, the touch sensor array 32 can be used to alter the various cooking parameters (temperature, etc.). The speed at which the sliding becomes smoother or waxier can be dependent on the type of cook mode being performed since the temperature range available is different depending on whether the user has selected to bake, broil, convection bake, or has turned on a warming drawer.

Along similar lines, this can also be useful when the user interface 20 is used to control both cooking related functions, as well as auxiliary features of the appliance that are unrelated to cooking functions (i.e., unrelated to the electrically controlled heating elements). The user interface has a selector that is manipulated to switch control of the touch-sensitive circuit between altering the first operational setting and the second operational setting. The user can select, for example, the auxiliary feature using the auxiliary control buttons 58 (shown as 58*a* for selecting a clock, 58*b* for selecting a timer, and 58c for selecting a fan) for operating one or more auxiliary electronic control features. Other different features are contemplated. In these examples, the user can utilize the touch sensor array 32 to change the time of the clock, increase or decrease the amount of time for a timer, or increase or decrease the speed of a fan (such as a convection fan or circulation fan inside the oven cavity, or an exhaust fan for the cooktop). The user can also toggle back to the burner or oven cavity feature and make other adjustments there. An indicator, such as text or graphic display 42 or even an illumination of the buttons 52, 54, 56, 58, is operable to identify which of the first and second operational settings of the appliance is currently being controlled.

Sharing the touch sensor array 32 to make adjustment of all of these different features is made convenient and understandable to the user by the electrovibration feedback circuit 60, despite a number of different settings which have different granularity of available levels. For example, adjustment of the clock or timer is performed in both minutes and hours within a 12 hour range, while the oven temperature can be adjusted within a range of 0° F. to 550° F. in 1° F. increments (or other increments, such as 5° F. or 10° F.). When making adjustments to the highly different features, an adjustment increment of a first operational setting can be different than an adjustment increment of a second operational setting, and the vibratory feedback can be approximately equal for an incremental adjustment of both the first and second operational settings. For example, selecting of an oven temperature of 350° F. for a bake operation using a 5° F. increment results in 70 unit increments selected using the touch sensor array 32, while subsequently selecting a timer amount of 30 minutes may be done on a per-minute basis that results in 30 unit increments selected using the touch sensor array 32. Alternatively, where an adjustment increment of the first operational setting is different than an adjustment increment of the second operational setting, the vibratory feedback can be greater for an incremental adjustment of the first operational setting as compared to the vibratory feedback for an incremental adjustment of the second operational setting. For example, the magnitude of friction change may increase relatively more when selecting a cooking temperature (such as relatively stickier/rougher as the temperature selection increases), as compared with a selection of a cooking time for the timer (which might be the same along the range, and/or linear or non-linear). These vastly different levels of granularity in settings can be indicated using correspondingly different magnitudes of finger friction provided by the electrovibration feedback circuit 60 as respective settings are adjusted via user inputs, such that the user has an almost immediate implicit understanding of the control-input step magnitude when making control inputs. Increasing and decreasing how rough a slider pad feels immediately provides this feedback, which would otherwise be missing from conventional controls.

The invention has been described with reference to the example embodiments described above. Modifications and alterations will occur to others upon a reading and understanding of this specification. Example embodiments incorporating one or more aspects of the invention are intended to include all such modifications and alterations insofar as they come within the scope of the appended claims.

What is claimed is:

1. A cooking appliance comprising:
   an electrically controlled heating element operable to elevate a temperature of food items and being configured to operate according to a first operational setting;
   a user interface comprising:
      a portion of an external surface of the cooking appliance comprising a touch sensor array to sense movement of a user's finger over the external surface to input instructions for altering at least the first operational setting, and
      an electrovibration feedback circuit coupled to the external surface that generates a vibratory feedback that is sensible by said user's finger at the external surface in response to a control input made thereon for adjusting at least said first operational setting,
      said electrovibration feedback circuit being configured to generate said vibratory feedback via an electrostatic force that simulates friction between said user's finger and the external surface, and to adjust a magnitude of the vibratory feedback in a manner that corresponds to, and thereby reflects, a magnitude or level of adjustment of said first operational setting based on said control input; and
   a controller operatively connected to said user interface and configured to make said adjustment of said first operational setting in response to said control input;
   wherein the electrically controlled heating element provides a variable size cooking zone defined at least in part by a first heating segment operable via the first operational setting and a second heating segment operable via a second operational setting that is independently controllable from the first operational setting, and
   wherein the size of the cooking zone is increased or decreased by selective operation of the first and second operational settings and the magnitude of the vibratory feedback is increased or decreased corresponding to the size of the cooking zone.

2. The cooking appliance of claim 1, wherein the first operational setting is adjustable in a non-linear manner.

3. The cooking appliance of claim 2, wherein an adjustment increment of the first operational setting is different than an adjustment increment of the second operational setting, and the magnitude of the vibratory feedback is approximately equal for the adjustment increment of both the first and second operational settings.

4. The cooking appliance of claim 1, wherein an adjustment increment of the first operational setting is different than an adjustment increment of the second operational setting, and the magnitude of the vibratory feedback is greater for the adjustment increment of the first operational setting as compared to the magnitude of the vibratory feedback for the adjustment increment of the second operational setting.

5. The cooking appliance of claim 1, wherein the controller alters the first and second operational settings by increasing or decreasing a level of power output of the first and second heating segments.

6. The cooking appliance of claim 1, said heating element comprising a heating coil electrically connected to a generator to conduct a high-frequency alternating current produced by the generator and induce an induced current in a cooking vessel supported above said heating coil.

7. The cooking appliance of claim 1, said heating element comprising an electrically resistive element that is heated by electric current flowing therethrough.

8. The cooking appliance of claim 1, said heating element being supported below a cooktop surface, wherein the cooktop surface comprises the external surface of the user interface.

9. The cooking appliance of claim 1, wherein the touch-sensitive circuit comprises a capacitive-touch sensor.

10. The cooking appliance of claim 1, said electrically controlled heating element being operable in a first power output range and a second power output range higher than the first power output range,
   wherein an adjustment increment of the first power output range is smaller than an adjustment increment of the second power output range, and
   wherein the magnitude of the vibratory feedback in the first output range is lower than the magnitude of the vibratory feedback in the second output range.

11. The cooking appliance of claim 10, wherein the first power output range provides a first maximum power output to the heating element, and the second power output range provides a second maximum power output to the heating element that is greater than the first maximum power output.

12. The cooking appliance of claim 1, further comprising:
   an auxiliary electronic control operable via an auxiliary operational setting to alter an auxiliary feature of the cooking appliance that is unrelated to the electrically controlled heating element, wherein:
      the electrovibration feedback circuit is further configured to generate said vibratory feedback that is sensible by said user's finger at the external surface in response to the control input made thereon for adjusting the auxiliary operational setting,
      said electrovibration feedback circuit being further configured to adjust the magnitude of the vibratory feedback in a manner that corresponds to, and thereby reflects, the adjustment of said auxiliary operational setting based on said control input,
      the magnitude of the vibratory feedback is different for an adjustment of the first operational setting as compared to adjustment of the auxiliary operational setting; and
      the controller is further configured to make said adjustment of the auxiliary operational settings in response to said control input.

13. The cooking appliance of claim 12, wherein the user interface further comprises a selector that is manipulated to switch control of the touch-sensitive circuit between altering the first operational setting and the auxiliary operational setting, and
   wherein the user interface further comprises an indicator that is operable to identify which of the first and auxiliary operational settings of the appliance is currently being controlled.

14. The cooking appliance of claim 12, wherein at least one of the first operational setting and the auxiliary operational setting is adjustable in a non-linear manner.

15. The cooking appliance of claim 12, wherein the auxiliary feature of the cooking appliance comprises one of a timer, a clock, and a fan.

16. The cooking appliance of claim 12, wherein an adjustment increment of the first operational setting is different than an adjustment increment of the auxiliary operational setting, and the magnitude of the vibratory feedback is approximately equal for an incremental adjustment of both the first and auxiliary operational settings.

17. The cooking appliance of claim 12, wherein an adjustment increment of the first operational setting is different than an adjustment increment of the auxiliary operational setting, and the magnitude of the vibratory feedback is greater for an incremental adjustment of the first operational setting as compared to the magnitude of the vibratory feedback for an incremental adjustment of the auxiliary operational setting.

18. The cooking appliance of claim 12, wherein the electrically controlled heating element further comprises at least two heating segments that together form a variable size cooking zone that is increased or decreased in size by selective operation of the at least two heating segments.

19. The cooking appliance of claim 12, wherein the electrically controlled heating element comprises one of an electrically resistive element and an inductive heating coil.

20. The cooking appliance of claim 1, wherein the user interface further comprises:
   a bar graph separate from, and adjacent to, the touch sensor array, the bar graph being formed by a plurality of light-emitting elements,
   wherein the magnitude or level of said adjustment is displayed to the user by the plurality of light-emitting elements of the bar graph.

21. The cooking appliance of claim 1, wherein the magnitude or level of said adjustment of said first operational setting corresponds to a speed of the movement of the user's finger across the touch sensor array.

* * * * *